(12) United States Patent
Raaijmakers et al.

(10) Patent No.: US 6,492,283 B2
(45) Date of Patent: Dec. 10, 2002

(54) METHOD OF FORMING ULTRATHIN OXIDE LAYER

(75) Inventors: Ivo Raaijmakers, Bilthoven (NL); Yong-Bae Kim, Cupertino, CA (US); Marko Tuominen, Espoo (FI); Suvi P. Haukka, Helsinki (FI)

(73) Assignee: ASM Microchemistry Oy, Espoo (FI)

( * ) Notice: Subject to any disclaimer, the term of this patent is extended or adjusted under 35 U.S.C. 154(b) by 0 days.

(21) Appl. No.: 09/791,167

(22) Filed: Feb. 22, 2001

(65) Prior Publication Data

US 2001/0031562 A1 Oct. 18, 2001

Related U.S. Application Data

(60) Provisional application No. 60/184,046, filed on Feb. 22, 2000.

(51) Int. Cl.$^7$ ........................ H01L 21/31; H01L 21/469
(52) U.S. Cl. ................ 438/770; 438/769; 438/778; 438/787; 438/756; 438/694; 438/906
(58) Field of Search .................. 438/758, 765, 438/769, 770, 774, 778, 745, 787, 790, 756, 694, 623, 635, 906

(56) References Cited

U.S. PATENT DOCUMENTS

| | | | |
|---|---|---|---|
| 4,058,430 A | 11/1977 | Suntola et al. | 156/611 |
| 4,747,367 A | 5/1988 | Posa | 118/715 |
| 4,761,269 A | 8/1988 | Conger et al. | 422/245 |
| 5,071,670 A | 12/1991 | Kelly | 427/38 |
| 5,476,816 A * | 12/1995 | Mautz et al. | 438/622 |
| 5,769,950 A | 6/1998 | Takasu et al. | 118/715 |
| 5,916,365 A | 6/1999 | Sherman | 117/92 |
| 6,124,158 A | 9/2000 | Dautartas et al. | 438/216 |
| 6,124,214 A * | 9/2000 | Hembree et al. | 438/745 |
| 6,200,893 B1 * | 3/2001 | Sneh | 438/685 |

FOREIGN PATENT DOCUMENTS

WO    WO 00/54320    9/2000

OTHER PUBLICATIONS

Lee et al. "Dry release for surface micromachining with vapor–phase etching", 1997, IEEE, pp. 226–233.*
Lee et al. "Gas–phase etching of sacrificial oxides using anhydrous HF and CH3OH", 1997, IEEE, pp. 448–453.*
Abeles, B. et al., "Amorphous Semiconductor Superlattices," *Physical Review Letters*, vol. 51, No. 21, pp. 2003–2006 (1983).

(List continued on next page.)

*Primary Examiner*—Carl Whitehead, Jr.
*Assistant Examiner*—Maria Guerrero
(74) *Attorney, Agent, or Firm*—Knobbe, Martens, Olson & Bear LLP

(57) ABSTRACT

A method is disclosed for forming an ultrathin oxide layer of uniform thickness. The method is particularly advantageous for producing uniformly thin interfacial oxides beneath materials of high dielectric permittivity, or uniformly thin passivation oxides. Hydrofluoric (HF) etching of a silicon surface, for example, is followed by termination of the silicon surface with ligands larger than H or F, particularly hydroxyl, alkoxy or carboxylic tails. The substrate is oxidized with the surface termination in place. The surface termination and relatively low temperatures moderate the rate of oxidation, such that a controllable thickness of oxide is formed. In some embodiments, the ligand termination is replaced with OH prior to further deposition. The deposition preferably includes alternating, self-limiting chemistries in an atomic layer deposition process, though any other suitable deposition process can be used. Two or more of the HF etching, surface termination, oxidation, hydroxyl replacement of the surface termination and deposition on the oxide can be conducted in situ.

37 Claims, 4 Drawing Sheets

OTHER PUBLICATIONS

Andersohn, L. et al., "In situ observation of water adsorption on Si(100) with scanning tunneling microscopy," *Surface Science*, vol. 284, pp. 77–90 (1993).

Desu, C. S. et al., "Enhanced dielectric properties of modified $Ta_2O_5$ thin films," *Mat. Res. Innovat.*, vol. 2, pp. 299–302 (1999).

Fadley, C.S. et al., "Angle–Resolved X–Ray Photoelectron Spectroscopy," *Progress in Surface Science*, vol. 16, pp. 275–388 (1984).

Grunthaner P.J. et al., "The localization and crystallographic dependence of Si suboxide species at the $SiO_2$/Si interface," *J. Appl. Phys.*, vol. 61, No. 2, pp. 629–638 (1987).

Haukka, S., "Analytical and chemical techniques in the study of surface species in atomic layer epitaxy," *Thin Solid Films*, vol. 225, pp. 280–283 (1993).

Haukka, S., "An IR and NMR Study of the Chemisorption of $TiCl_4$ on Silica," *J. Phys. Chem.*, vol. 97, pp. 5085–5094 (1993).

Ibach, H. et al., "Vibrational Study of the Initial Stages of the Oxidation of Si(111) and Si(100) Surfaces," *Appl. Phys. A*, vol. 29, pp. 113–124(1982).

Ikeda, H. et al., "Oxidation of H–terminated Si(100) surfaces studied by high–resolution electron energy loss spectroscopy," *J. Appl. Phys.*, vol. 77, No. 10, pp. 5125–5129 (1995).

Kawai, M. et al., "Layer controlled growth of oxide superconductors," *Applied Surface Science*, vols. 82/83, pp. 487–493 (1994).

Kim, Sun–Oo et al., "The effects of substrate and annealing ambient on the electrical properties of $Ta_2O_5$ thin films prepared by plasma enhanced chemical vapor deposition," *Thin Solid Films*, vol. 253, pp. 435–439 (1994).

Kukli, K. et al., "Atomic Layer Epitaxy Growth of Tantalum Oxide Thin Films for $Ta(OC_2H_{55}$ and $H_2O$," *J. Electrochem. Soc.*, vol. 142, No. 5, pp. 1670–1674 (1995).

Kukli, K. et al., "Tailoring the dielectric properties of $HfO_2$–$Ta_2O_5$ nanolaminates," *Appl. Phys. Lett.*, vol. 68, No. 26, pp. 3737–3739 (1996).

Kukli, K. et al., "Properties of $Ta_2O_5$–Based Nanolaminates Deposited by Atomic Layer Epitaxy," *J. Electrochem. Soc.*, vol. 144, No. 1, pp. 300–306 (1997).

Kukli, K. et al., "In situ study of atomic layer epitaxy growth of tantalum oxide thin films from $Ta(OC_2H_5)_5$ and $H_2O$," *Applied Surface Science*, vol. 112, pp. 236–242 (1997).

Leskelä, M. et al., "Atomic Layer Epitaxy in Deposition of Various Oxide and Nitride Thin Films," *Journal De Physique IV. Colloque C5, supplemént au Journal de Physique II*, vol. 5, pp. C5–937–C5–951, (1995).

Morita, M. et al., "Growth of native oxide on a silicon surface," *J. Appl. Phys.*, vol. 68, No. 3, pp. 1272–1281 (1990).

Nakajima, A. et al., "Atomic–layer–deposited silicon–nitride/$SiO_2$ stacked gate dielectrics for highly reliable p–metal–oxide–semiconductor field–effect transistors," *Applied Physics Letters*, vol. 77, No. 18, pp. 2855–2857 (2000).

Nakakima, A. et al., "Low–temperature formation of silicon nitride gate dielectrics by atomic–layer deposition," *Applied Physics Letters*, vol. 79, No. 5, pp. 665–667 (2001).

Niimi, H. et al., "Preparation of Ultra–Thin Oxide Films by Low–Temperature Remote Plasma–Assisted Process," *Electrochemical Society Proceedings*, vol. 96–12, pp. 623–630 (1996).

Niinistö, L. et al., "Synthesis of oxide thin films and overlayers by atomic layer epitaxy for advanced applications," *Materials Science and Engineering*, vol. B41 pp. 23–29 (1996).

Niwano, M. et al., "Synchrotron–radiation–induced decomposition of thin native oxide films on Si(100)," *J. Appl. Phys.*, vol. 68, No. 11, pp. 5576–5583 (1990).

Niwano, M. et al., "Ultraviolet ozone oxidation of Si surface studied by photoemission and surface infrared spectroscopy," *J. Vac. Sci. Technol. A*, vol. 10, No. 5, pp. 3171–3175 (1992).

Ohmi, T. et al., "Native Oxide Growth and Organic Impurity Removal on Si Surface with Ozone–Injected Ultrapure Water," *J. Electrochem. Soc.*, vol. 140, No. 3, pp. 804–810 (1993).

Park, J.W., "Ultra Thin SiO2 Mask Layer for Nano–Scale Selective–Area PECVD of Si," *Mat. Res. Soc. Symp. Proc.*, vol. 448, pp. 271–276 (1997).

Ritala, M. et al., "Perfectly Conformal TiN and $Al_2O_3$ Films Deposited by Atomic Layer Deposition," *Chem. Vapor Deposition*, vol. 5, No. 1, pp. 7–9 (1999).

Ritala, M. et al., "Zirconium dioxide thin films deposited by ALE using zirconium tetrachloride as precursor," *Applied Surface Science*, vol. 75, pp. 333–340 (1994).

Ritala, M. et al., "Atomic Layer Deposition of Oxide Thin Films with Metal Alkoxides as Oxygen Sources," *Science*, vol. 288, pp. 319–321 (2000).

Sakaue, H. et al., "Digital Chemical Vapor Deposition of $SiO_2$ Using a Repetitive Reaction of Triethylsilane/Hydrogen and Oxidation," *Japanese Journal of Applied Physics*, vol. 30, No. 1B, pp. L–124–L–127 (1990).

Schulze, R.K. et al., "Room–temperature water adsorption on the Si(100) surface examined by UPS, XPS, and static SIMS," *Applied Surface Science*, vol. 81, pp. 449–463 (1994).

Singer, P., Editor–in–Chief, "Atomic Layer Deposition Targets Thin Films," *Semiconductor International*, vol. 22, No. 10, p. 40 (1999).

Sneh, O. et al., "Atomic layer growth of $Sio_2$ on Si(100) using $SiCl_4$ and $H_2O$ in a binary reaction sequence," *Surface Science*, vol. 334, pp. 135–152 (1995).

Sunada, T. et al., "The Role of Fluorine Termination in the Chemical Stability of HF–Treated Si Surfaces," *Japanese Journal of Applied Physics*, vol. 29, No. 12, pp. L2408–L2410 (1990).

Suntola, T., "Atomic Layer Epitaxy," *Materials Science Reports*, vol. 4, pp. 261–312 (1989).

Terada, N. et al., "Optical adsorption in ultrathin silicon oxide films near the $SiO_2$/Si interface," *Physical Review B*, vol. 46, No. 4, pp. 2312–2318 (1992).

Tiitta, M. et al., "Preparation and Characterization of Phosphorus–Doped Aluminum Oxide Thin Films," *Materials Research Bulletin*, vol. 33, No. 9, pp. 1315–1323 (1998).

Vehkamäki, M. et al., "Growth of $SrTiO_3$ and $BaTiO_3$ Thin Films by Atomic Layer Deposition," *Electrochemical and Solid–State Letters*, vol. 2, No. 10, pp. 504–506 (1999).

Wise, M.L. et al., "Diethyldiethoxysilane as a New Precursor for $SiO_2$ Growth on Silicon," *Mat. Res. Soc. Symp. Proc.*, vol. 334, pp. 37–43 (1994).

\* cited by examiner

METHOD OF FORMING ULTRATHIN OXIDE LAYER

REFERENCE TO RELATED APPLICATION

The present application claims the priority benefit under 35 U.S.C. §119(e) of provisional application No. 60/184,046, filed Feb. 22, 2000.

FIELD OF THE INVENTION

The invention relates generally to integrated circuit fabrication, and more particularly to providing an ultra-thin oxide layer of uniform thickness over semiconductor structures.

BACKGROUND OF THE INVENTION

Thin oxide layers are often desired over semiconductor surfaces in fabricating integrated circuits. For example, silicon oxide for conventional gate dielectrics for integrated transistors are typically grown on a single crystal silicon wafer or epitaxial silicon layer. Even for alternative gate dielectric materials, very thin silicon oxide layers are typically grown first for superior silicon/oxide interface characteristics. Similarly, silicon oxide is often grown on silicon electrodes in capacitors for memory cells, such as in dynamic random access memory (DRAM) arrays.

Prior to thermally growing silicon oxide, the silicon surface is desirably cleaned to avoid contamination and produce superior electrical properties. Among other things, the surface is generally cleaned of a naturally forming oxide known as "native oxide."

As is well known in the art, native oxide forms naturally over bare silicon surfaces even upon exposure to clean room environments at room temperature. Typically, native oxide comprises a few angstroms of silicon oxide, a substantial portion of the dielectric film to be formed. While a thermal oxide can be grown through the native oxide to complete the desired dielectric layer, the quality and thickness of the native oxide are inconsistent across the silicon surface. Moreover, the native oxide left after long transportation and/or storage is typically contaminated with impurities.

Accordingly, native oxide is typically removed from the surface with solutions such as dilute hydrofluoric acid (HF) baths or HF vapor etching. Dipping the wafers in a dilute HF bath cleans the silicon surface native oxide and leaves the surface hydrogen terminated. HF vapor etching similarly cleans the silicon surface and terminates dangling silicon bonds, but the surface termination includes a substantial fluorine content. Hydrogen termination is not very stable, particularly at elevated temperatures. The hydrogen atoms readily desorb to leave the dangling silicon bonds that tend to attract atmospheric contaminants. Even with hydrogen and fluorine termination in place, atmospheric oxidants can still diffuse through the termination layer between HF treatment and subsequent processing. Thus, HF treatment cleans the wafer surface but leaves the surface inadequately protected for the period between cleaning and further processing. The composition of this regrown oxide strongly depends on many different conditions, such as the doping levels within the silicon and concentration of moisture within the air, such that this oxide regrowth is also inconsistent and difficult to control.

One manner in which a clean silicon surface can be maintained for longer periods of time is to quickly grow a thin silicon oxide passivation layer after cleaning the silicon surface. Such a passivation layer can also be used to provide improved interface characteristics between a silicon structure and more advanced dielectric materials, such as those exhibiting high dielectric permittivity (high-k dielectrics). Spontaneous oxide regrowth, such as by room temperature exposure to typical oxidants like air or water, results in a very slow reaction, which is unacceptable for commercial fabrication. Studies show that oxide regrowth after HF treatment, sufficient to provide a thin silicon oxide passivation layer, can take on the order of $10^3$ to $10^4$ minutes.

As is well known, this oxidation rate can be increased by heating the wafer during oxidation. Unfortunately, thermal oxidation at temperatures greater than 500° C. causes the hydrogen termination left by HF treatment to desorb well before temperatures reach the level at which significant oxidation takes place. In the interim, the silicon surface is left unprotected. Moreover, thermal oxidation of the initially bare silicon substrate proceeds rapidly and by mechanisms that are not well understood, as compared to latter stages during which oxidants diffuse through an already-grown portion of the silicon oxide. Accordingly, when attempting to provide oxide thicknesses appropriate for passivation and interface improvement beneath high-k materials, the oxidation is not easily controlled and can easily exceed the desired thickness.

Oxidation can be more easily controlled using room temperature wet oxidation by immersion in water. Dissolving ozone in water can improve the oxidation rate relative to water alone. Moreover, concentration of the dissolved ozone can be controlled to tailor the growth rates. Unfortunately, wet processing is not compatible with rapid sequential processing steps. Wet processing stations are typically separated from cluster tools, as moisture can be corrosive to vapor processing tools like chemical vapor deposition (CVD) reactors and vapor etching tools.

Accordingly, there is a need for improved methods for providing passivation layers over silicon surfaces. Such methods should desirably be finely controllable for tailoring passivation layer thicknesses between about 0.1 nm and 1.2 nm.

SUMMARY OF THE INVENTION

The preferred embodiments present methods of growing extremely fine oxide layers in a controllable fashion. In particular, the rapid growth of thermal oxidation is tempered by forcing such oxidation to take place through a protective layer of surface termination or ligands.

In the illustrated embodiments, termination of silicon surfaces left by HF vapor or wet etching (which cleans native oxide from a silicon surface) is replaced by oxidation-moderating or -inhibiting ligands. The ligands can comprise OH formed from exposure of the clean silicon to water ($H_2O$). In another embodiment, the ligands comprise more effective oxidation-moderating species. For example, such oxidation-moderating termination can be formed by exposing the clean silicon to compounds capable of forming alkoxides, such as alcohols, or to carboxylic acids.

Oxidation is then conducted through the surface termination. Temperatures for this process are preferably maintained between about room temperature (25° C.) and 400° C. Preferably, the oxide grown through the surface termination comprises between about 0.1 nm and 1.2 nm, formed uniformly across the silicon surface. Following oxidation, the surface termination is replaced, if necessary, with OH termination, which advantageously facilitates deposition of a further dielectric layer upon the oxide. Further deposition can be by chemical vapor deposition (CVD), physical vapor deposition (PVD), atomic layer deposition (ALD) or any other film deposition method known in the art. Most preferably, the further dielectric layer is characterized by a high permittivity constant (e.g., greater than about 10).

Advantageously, the methods can be implement with two or more sequential steps conducted in situ, i.e., without removing the workpiece from a reaction chamber between steps.

An exemplary context for the invention is the formation of a uniform gate dielectric, incorporating a high k dielectric with an interfacial oxide over a semiconductor substrate, for use in a transistor gate stack.

BRIEF DESCRIPTION OF THE DRAWINGS

These and other aspects of the invention will be readily apparent from the description below and the appended drawings, which are meant to illustrate and not to limit the invention, and wherein.

DETAILED DESCRIPTION OF THE PREFERRED EMBODIMENT

Figure 1:
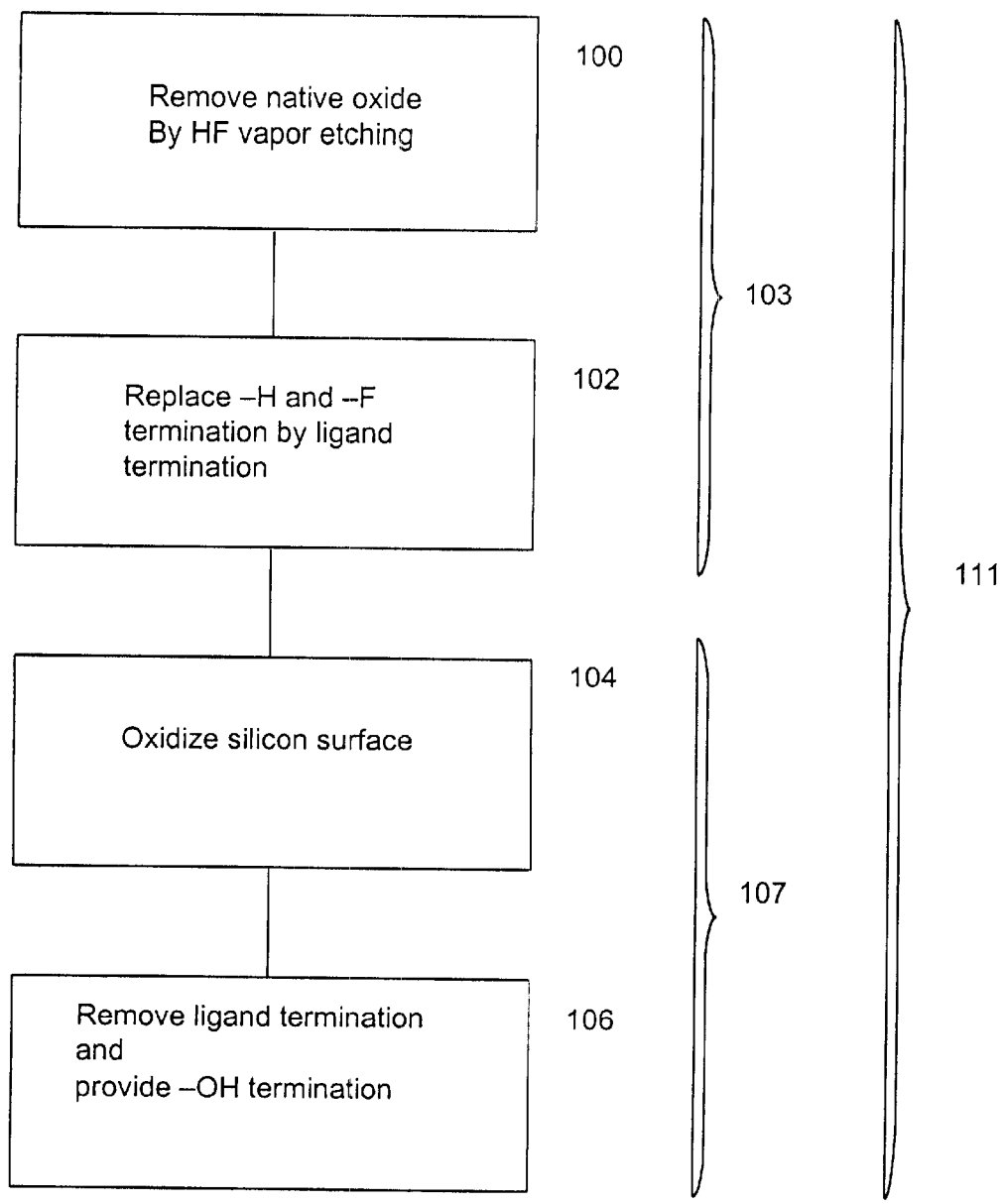
FIG. 1 is a flow chart, generally illustrating a method of removing a native oxide layer by HF vapor etching and forming a thin silicon oxide layer with —OH termination on a silicon surface.

While illustrated in the context of oxidation of a bare silicon substrate, the skilled artisan will readily find application for the principles disclosed herein to controlling film growth in a number of other contexts. For example, thin oxide layers can be formed over metal surfaces. Thus, "substrate" as used herein refers to any layer or structure over which an oxide is to be grown. A silicon substrate may comprise a silicon wafer or silicon layer, such as polysilicon, epitaxial silicon or amorphous silicon, with or without dopants for electrical conductivity. The preferred embodiments have particular utility for forming a thin interfacial oxide layer over a silicon wafer or epitaxial silicon layer for use in a transistor gate dielectric that includes further high k materials over the interfacial oxide layer.

It is an object of the preferred embodiments to provide a silicon oxide layer and a low temperature method for tailoring, on a monolayer scale, the thickness of the silicon oxide layer with —OH group termination on a silicon surface. A further object is to provide a silicon oxide interface layer between a silicon substrate and a high-k dielectric film and a low temperature method to control the thickness of the silicon oxide interface layer.

More particularly, a method is disclosed for providing on a silicon surface a silicon oxide layer, having a finely a tailored thickness between about 0.1 nm and 1.2 nm, with —OH group termination. Desirably, process temperatures are maintained below about 400° C. during oxidation. Oxidation rates are enhanced by providing oxidants more reactive than oxygen and/or by elevating the oxidation temperature, a preferably to a temperature between about 50° C. and 400° C., more preferably between about 300° C. and 400° C.

In the embodiments, a method is described for forming a thin silicon oxide film on a silicon surface, allowing control of the silicon oxide thickness on a monolayer scale. This method comprises: first removing native oxide from the silicon surface; providing a termination of the silicon surface with ligands larger than —H or —F; oxidizing the silicon through the surface termination; removing the surface termination with ligands and replacing (if necessary) with —OH termination.

The dangling bonds at the silicon surface have a strong tendency to bond with groups or radicals present in the ambient. After HF etching, the silicon dangling bonds are practically completely terminated by atomic hydrogen or fluorine. Hydrogen is the smallest atom in existence and fluorine is the smallest halide atom. They do not provide any significant barrier for the diffusion of the oxidant to the silicon surface.

In the illustrated embodiments, however, the hydrogen termination is replaced by a termination with a larger group. The surface is thus partially blocked, and the diffusion of the oxidant towards the surface proceeds slower. This substantially dampens the oxidation rate, particularly during the initial stages of the growth, which typically proceeds relatively fast.

By selecting the size of the ligands, the permeability of the diffusion barrier can be tailored, the oxidation rate can be controlled, and the final oxide thickness can be adjusted. Furthermore, the increasing oxide thickness contributes to the overall diffusion barrier and the oxidation process has the tendency to be self-limiting in oxide thickness. Exposure of the silicon surface to water vapor results in replacement of the hydrogen termination of the dangling bonds with an OH termination. The OH group is substantially larger than the H atom and thus already has a strong moderating effect on the oxidation rate. In addition to the diffusion barrier that is provided by the surface termination with ligands, other effects like bonding strength, polarity etc. will be of influence to the oxidation rate. Consequently the mere occupation of the dangling bonds by ligands can and will influence the oxidation rate. Thus, in accordance with one embodiment of the invention, the ligands are OH groups formed by exposure to $H_2O$.

More preferably, the ligands are larger and more oxidation-moderating than OH groups. For example, in one embodiment, the ligands comprise alkoxy tails, formed from exposure of the HF-cleaned surface to compounds capable of forming alkoxides, particularly alcohols such as methanol, ethanol and propanol. In forming alkoxides from an alcohol, hydrogen from the hydroxyl group is replaced with another atom, such as metal or silicon. For example, where ethanol ($CH_3CH_2OH$) is employed, the resulting silicon derivative is silicon ethoxide, $Si(OCH_2CH_3)_x L_{4-x}$, containing at least one ethoxide group (x=1 to 4) and L is a bond to another atom or group. In another embodiment, the ligands comprise carboxylic tails, formed from exposure to carboxylic acids such as formic acid and acetic acid. In these more preferred embodiments, the ligands are provided after cleaning native oxide (preferably by HF etching) from the surface and prior to oxidizing the surface by exposing the cleaned silicon surface to the alkoxide or carboxylic acid. Optionally, the ligands are also provided during the oxidation step.

In one embodiment of this invention, the oxidant has a stronger oxidizing effect than oxygen or water vapor alone. Oxidation with such oxidizers can be conducted at low temperatures, preferably less than 300° C., more preferably less than 200° C. An exemplary strong oxidizer, in accordance with this embodiment, is an ozone-containing gas. In an alternative embodiment, this ozone-containing gas is mixed with water vapor, oxygen or an inert gas like a noble gas or $N_2$. Another exemplary strong oxidizer comprises a peroxide-containing gas. Still another strong oxidizing agent comprises oxygen active species generated by a remote plasma generator or an in situ plasma generator.

In an alternative embodiment, the oxidant is water vapor. Although at room temperature, the oxidation rate in water vapor is very low, the temperature can be increased to between about 50° C. and 400° C., more preferably between about 300° C. and 400° C. Furthermore, in this case ligands can be provided on the silicon surface that enhance the oxidation rate or the water vapor can be mixed with other gases that enhance the oxidation rate like $O_2$, or halogen-containing gases like HCl. If desired, stronger oxidizing agents such as ozone or peroxide can also be provided during oxidation at elevated temperatures up to about 400° C.

After completion of the oxidation, the supply of oxidant (and ligands, if supplied during oxidation) to the surface is stopped and the substrate is purged with an inert gas. In one embodiment, the formation of the silicon oxide film and purging of the substrate is followed by exposing to an agent that provides a —OH termination. In another arrangement, the —OH termination can replace the previous termination in a ligand exchange reaction.

In a further embodiment, the formation of a thin silicon oxide film with controlled thickness and —OH termination is followed by the deposition of a further film by means of chemical vapor deposition (CVD), physical vapor deposition (PVD) or atomic layer deposition (ALD). In ALD, the substrate is exposed alternately and subsequently to pulses of two or more different reactants, which pulses are separated from each other by evacuation and/or purging of the reaction space. After the adsorption of a monolayer of molecules of the first reactant on the surface, no further adsorption takes place. During exposure with a second reactant, the second reactant adsorbs on and reacts with all the available molecules of the first reactant and then no further adsorption takes place. This process is repeated and a film is grown monolayer by monolayer.

Desirably, the film deposited over the thin silicon oxide is a high-k dielectric film, preferably deposited by ALD. "High-k" generally refers to a dielectric material having a dielectric constant (k) value greater than that of silicon dioxide. Preferably, the high k material has a dielectric constant greater than 5, more preferably greater than about 10. Exemplary high-k materials for which ALD processes have been developed include $ZrO_2$, $Al_2O_3$, lanthanide oxides and even ultrahigh-k materials such as BST, ST, etc. In one arrangement, aluminum oxide is formed above and/or below a further dielectric material to serve as a barrier layer, most preferably sandwiching another high k layer. Controlling the thickness of the underlying silicon oxide film on a monolayer scale to achieve a target thickness of a few monolayers is particularly advantageous for such high-k applications, since thickness variations can have significant impact upon overall uniformity of the compound dielectric.

Prior to etching oxide from the substrate, the substrate is cleaned, preferably in a manner that grows a chemical oxide in the cleaning process. In the illustrated embodiments, the substrate comprises a <100> silicon wafer surface, and cleaning comprises treatment in a sulfuric acid/hydrogen peroxide mixture (SPM) for 20 minutes followed by a 30 second deionized water (DI) rinse. In other arrangements, an ammonium hydroxide/hydrogen peroxide mixture (APM) is used for the pre-etch cleaning step. In either case, a thin chemical oxide is grown from the substrate, consuming imperfections and removing impurities from the substrate surface in the process. Other cleaning arrangements may not themselves grow a chemical oxide; however, following cleaning, exposure to a clean room environment will almost instantly grow a native oxide, in the absence of protective surface termination.

Oxide is then etched from the substrate surface, in accordance with the described embodiments.

Referring to the appended figures, five different process steps are indicated throughout the figures by the numerals (100), (102), (104), (106) and (108):

(100) indicates an HF process for removing the oxide present on the silicon surface.

Figure 3:
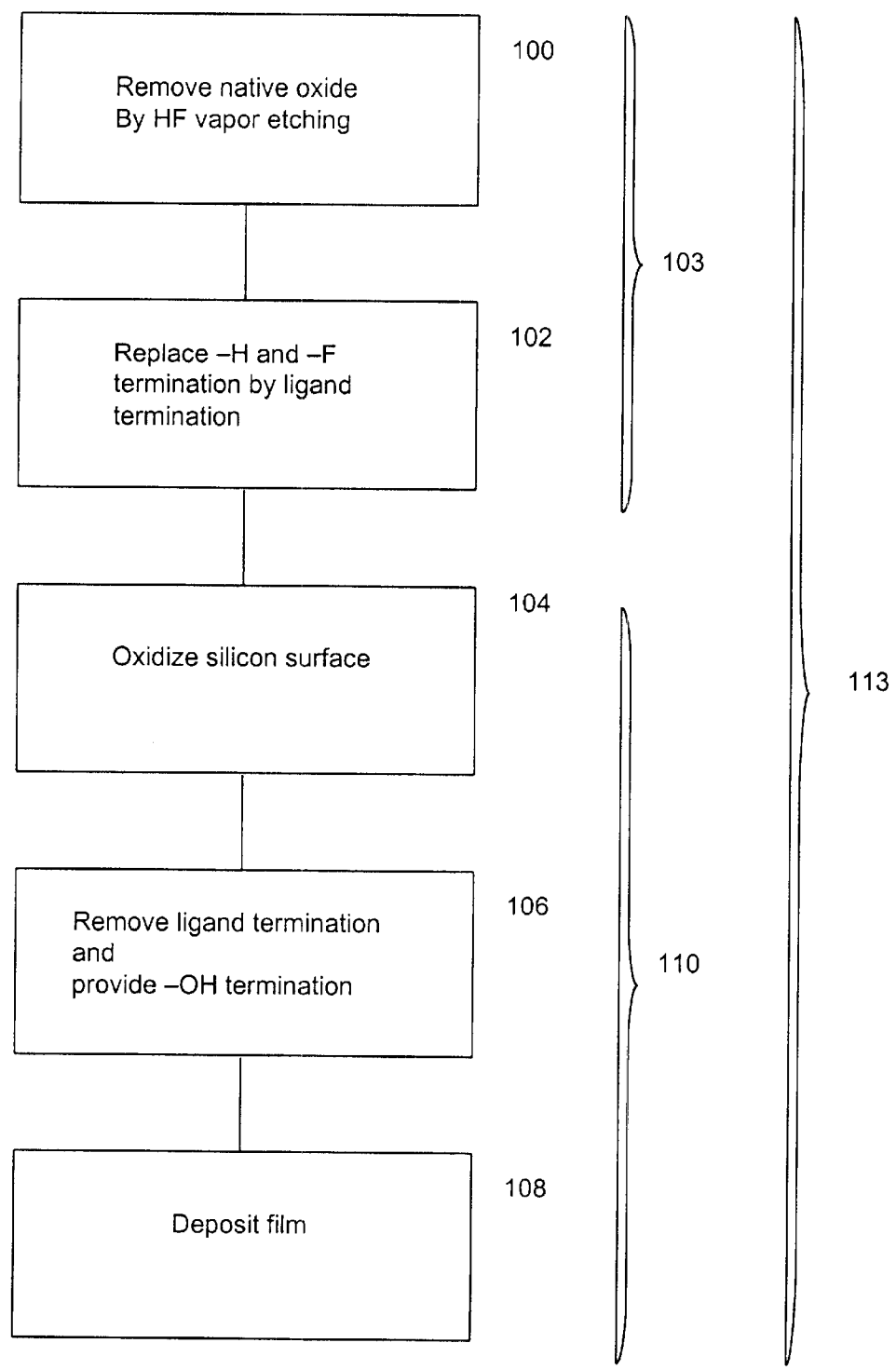
FIG. 3 is a flow chart, generally illustrating a method of removing a native oxide layer by HF vapor etching, forming a thin silicon oxide layer with —OH termination on a silicon surface followed by depositing a film over the thin silicon oxide.

This can be any HF vapor process or wet process known in the art. Preferably, the vapor process described in U.S. Pat. No. 5,922,624 ("the '624 patent"), using mixtures of HF and acetic acid, is employed for the embodiments of FIGS. 1 and 3. The disclosure of the '624 patent is hereby incorporated herein by reference.

Figure 2:
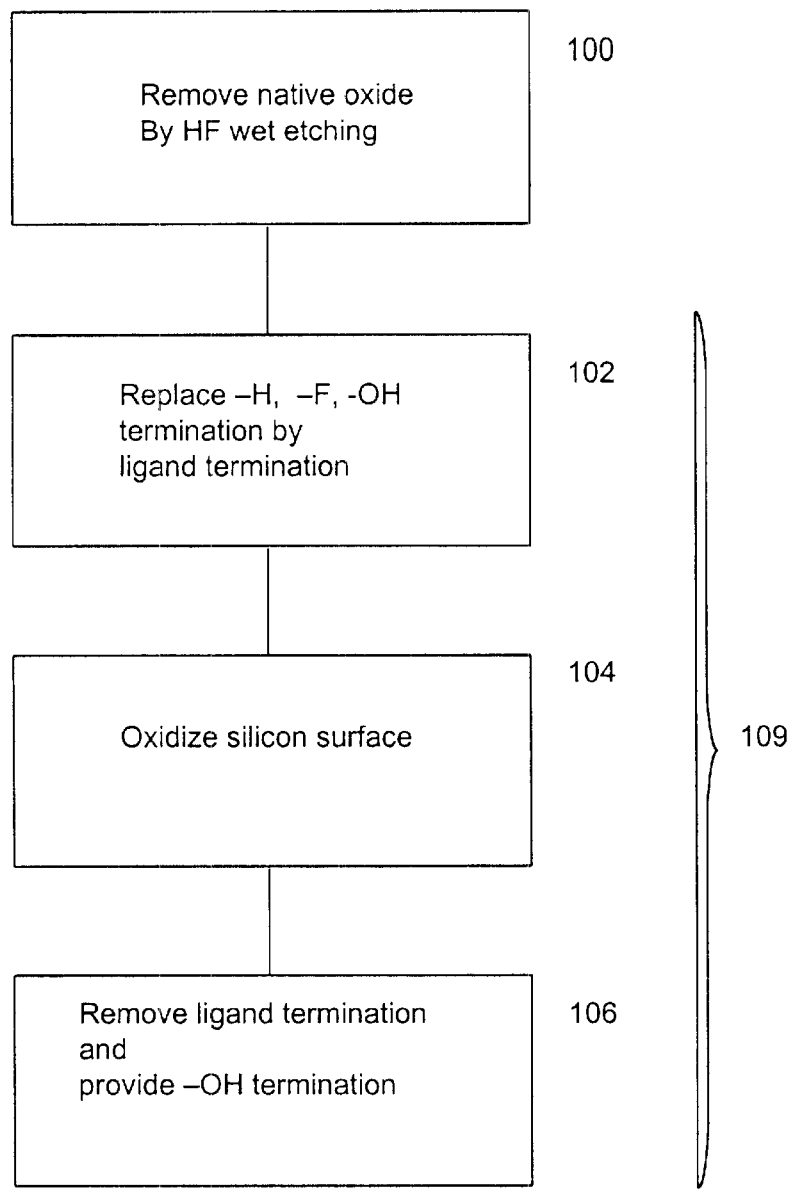
FIG. 2 is a flow chart, generally illustrating a method of removing a native oxide layer by HF wet etching and forming a thin silicon oxide layer with —OH termination on a silicon surface.
Figure 4:
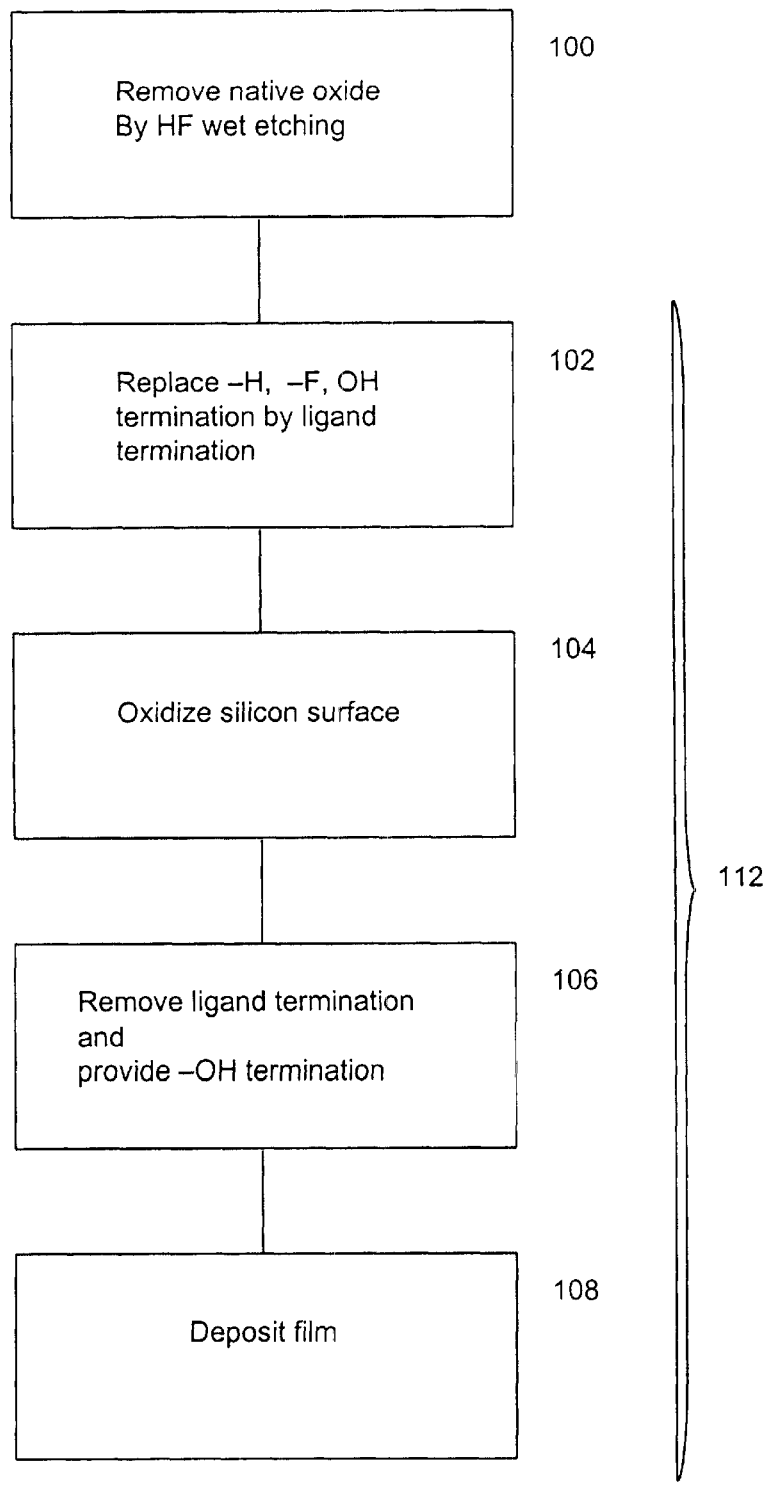
FIG. 4 is a flow chart, generally illustrating a method of removing a native oxide layer by HF wet etching and forming a thin silicon oxide layer with —OH termination on a silicon surface followed by depositing a film over the thin silicon oxide film.

Preferably, HF wet etching, such as a 0.5% HF dip for 4 minutes, is employed for the embodiments of FIGS. 2 and 4.

(102) indicates the replacement of the termination of the silicon surface present after HF etching by a ligand termination that moderates the oxidation rate. The ligands are larger than H or F, and can comprise —OH tails. More preferably, the ligands for the oxidation-moderating surface termination are larger than hydroxyl tails, such as alkoxy or carboxylic tails. This surface termination can be attained, for example, by exposing the etched silicon surface to compounds capable of forming alkoxides (e.g., alcohols such as methanol, ethanol or propanol) or carboxylic acids (e.g., formic acid or acetic acid).

(104) indicates the oxidation of the silicon surface by means of a reactive oxidant, preferably an ozone-containing gas. This oxidation can be performed at atmospheric pressure or at reduced pressure. At reduced pressure the lifetime of the ozone will be longer. The oxidation is preferably performed at low temperature. For convention oxidants (e.g., $H_2O$, $O_2$) in the range from about room temperature to about less than about 500° C., preferably about 50° C. to 400° C., more preferably about 300° C. to 400° C. Where a "strong" oxidizer is employed, the temperature is more preferably less than about 300° C., and most preferably less than about 200° C.

(106) indicates the removal of the ligands and providing —OH termination on the silicon oxide surface. This step comprises purging with a purge gas to remove the ligands. The purge gas can be an inert gas but another gas like methanol or ethanol or other solvent gases can alternatively be used to remove the ligands.

When a solvent gas performs purging, the solvent gas in some instances can simultaneously provide the —OH termination. The —OH termination can also be provided by subsequent exposure to water vapor.

(108) indicates the deposition of a subsequent film by means of chemical vapor deposition (CVD), physical vapor deposition (PVD), atomic layer deposition (ALD) or any other deposition process known in the art. The preferred embodiments are of particular advantage in the case of the deposition of a high-k dielectric film. The preferred embodiments also preferably provide a termination (—OH) of the resultant oxide layer that is readily employed in a subsequent atomic layer deposition.

In accordance with another aspect of the invention, several process steps can be performed sequentially in one reaction chamber, preferably "in situ", i.e., without removing the workpiece from the chamber between steps. Several groupings of process steps to be performed in one chamber are indicated in the figures by brackets and the following numerals:

(103) (FIG. 1) indicates the integration of the HF vapor process and providing the oxidation moderating ligands in one reaction chamber.

(107) (FIG. 1) indicates the integration of the oxidation, the removal of the ligands and providing the —OH termination in one chamber.

(109) (FIG. 2) indicates the integration of providing the oxidation-moderating ligands, the oxidation, the removal of the ligands and providing the —OH termination in one chamber, following ex situ wet HF etching.

(110) (FIG. 3) indicates the integration of the oxidation, the removal of the ligands, providing the —OH termination and the deposition of the subsequent film in one chamber. Preferably, the deposition comprises alternating exposure to reactants, each cycle producing no more than about a monolayer of a desired material in self-limiting ALD process.

(111) (FIG. 1) indicates the removal of the native oxide by HF vapor etching, providing the oxidation-moderating ligands, the oxidation, the removal of the ligands and providing the —OH termination.

(112) (FIG. 4) indicates the providing the oxidation-moderating ligands, the oxidation, the removal of the ligands, providing the —OH termination and the deposition of the subsequent film in one chamber following ex situ wet HF etching.

(113) (FIG. 3) indicates the removal of the native oxide by HF vapor etching, the providing the oxidation-moderating ligands, the oxidation, the removal of the ligands, providing the —OH termination and the deposition of the subsequent film in one chamber.

As an alternative, the different process steps can be performed in different chambers that are part of a cluster tool. In this way, the time between process steps and the ambient during transportation are very well controlled.

We claim:

1. A method for growing an oxide layer from a substrate, the method comprising:
    exposing the substrate to an etchant, wherein the etchant is capable of etching a native oxide from the substrate;
    forming a surface termination on the substrate after etching, the surface termination comprising ligands larger than hydrogen or fluorine atoms; and
    oxidizing the substrate through the surface termination to grow the oxide layer.

2. The method of claim 1, wherein the substrate comprises a silicon surface.

3. The method of claim 1, wherein oxidizing comprises employing a strong oxidizer.

4. The method of claim 1, wherein oxidizing comprises wet oxidation at between about 300° C. and 400° C.

5. The method of claim 1, wherein the oxide layer comprises silicon oxide with a thickness between about 0.1 nm and 1.2 nm.

6. The method of claim 2, wherein etching oxide from the substrate comprises exposing the substrate to hydrofluoric acid (HF).

7. The method of claim 6, wherein etching oxide from the substrate comprises an HF vapor etch.

8. The method of claim 6, wherein etching oxide from the substrate comprises wet etching the substrate with an aqueous solution of HF.

9. The method of claim 6, wherein forming the surface termination comprises replacing a hydrogen termination with hydroxyl groups.

10. The method of claim 6, wherein forming the surface termination comprises replacing a hydrogen termination with ligands larger than hydroxyl groups.

11. The method of claim 10, wherein forming the surface termination comprises exposing the substrate to a carboxylic acid.

12. The method of claim 10, wherein forming the surface termination comprises exposing the substrate to a compound capable of forming an alkoxide.

13. The method of claim 12, wherein the carboxylic acid is selected from the group consisting of formic acid and acetic acid.

14. The method of claim 10, further comprising continuing to supply the substrate with a source of the ligands while oxidizing the substrate through the surface termination.

15. The method of claim 12, wherein forming the surface termination comprises exposing the substrate to an alcohol.

16. The method of claim 15, wherein the alcohol is selected from the group consisting of methanol, ethanol and propanol.

17. The method of claim 3, wherein the strong oxidizer comprises an ozone containing gas.

18. The method of claim 3, wherein the strong oxidizer comprises a peroxide containing gas.

19. The method of claim 3, wherein oxidizing comprises maintaining a substrate temperature below about 300° C.

20. The method of claim 19, wherein oxidizing comprises maintaining a substrate temperature below about 200° C.

21. The method of claim 4, wherein oxidizing further comprises flowing $O_2$.

22. The method of claim 5, further comprising depositing a second dielectric material having a dielectric constant greater than about 5 over the silicon oxide.

23. The method of claim 22, wherein depositing the second dielectric material comprises atomic layer deposition.

24. A process for forming a transistor gate dielectric material on a silicon substrate, comprising:
    providing a substrate with a native oxide;
    etching the native oxide from the silicon substrate with hydrofluoric acid;
    forming a surface termination over the silicon substrate with ligands larger than hydrogen and fluorine;
    growing an interfacial oxide by oxidizing the silicon substrate after forming the surface termination, the interfacial oxide having a thickness between about 0.1 nm and 1.2 nm; and
    depositing a high k dielectric material over the interfacial oxide.

25. The method of claim 24, wherein etching oxide comprises HF vapor etching and forming the surface termination is conducted in situ following the HF vapor etching within one reaction chamber.

26. The method of claim 24, further comprising cleaning the silicon substrate prior to etching oxide, wherein cleaning includes growing a chemical oxide.

27. The method of claim 24, further comprising replacing the surface termination with a hydroxyl tail termination before depositing the high k dielectric material.

28. The method of claim 27, wherein depositing the high k dielectric material comprises an atomic layer deposition process.

29. The method of claim 27, wherein growing the interfacial oxide and replacing the surface termination with hydroxyl tail termination are conducted in situ within one reaction chamber.

30. The method of claim 28, wherein the high k dielectric material includes a material selected from the group consisting of aluminum oxide, zirconium oxide and lanthanide oxides.

31. The method of claim 29, wherein depositing the high k material is also conducted in situ within the one reaction chamber.

32. The method of claim 29, wherein forming the surface termination with ligands larger than hydrogen and fluorine is also conducted in situ within the one reaction chamber.

33. The method of claim 32, wherein etching oxide comprises HF vapor etching conducted in situ within the one reaction chamber.

34. The method claim 32, wherein depositing the high k dielectric material is also conducted in situ within the one reaction chamber.

35. The method of claim 26, wherein cleaning comprises exposing the substrate to an aqueous mixture comprising hydrogen peroxide.

36. The method of claim 35, wherein the aqueous mixture comprises an ammonium hydroxide and hydrogen peroxide mixture.

37. The method of claim 36, wherein the aqueous mixture comprises a sulfuric acid and hydrogen peroxide mixture.

* * * * *